(12) United States Patent  
Fay

(10) Patent No.: US 10,847,479 B2  
(45) Date of Patent: Nov. 24, 2020

(54) ANTENNA FORMATION BY INTEGRATED METAL LAYER OR REDISTRIBUTION LAYER

(71) Applicant: Micron Technology, Inc., Boise, ID (US)

(72) Inventor: Owen R. Fay, Meridian, ID (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

(21) Appl. No.: 16/208,766

(22) Filed: Dec. 4, 2018

(65) Prior Publication Data

US 2020/0176401 A1 Jun. 4, 2020

(51) Int. Cl.
  *H01L 23/66* (2006.01)
  *H01L 23/00* (2006.01)
  *H01Q 1/22* (2006.01)

(52) U.S. Cl.
  CPC .............. *H01L 23/66* (2013.01); *H01L 24/08* (2013.01); *H01Q 1/2283* (2013.01); *H01L 2223/6677* (2013.01); *H01L 2224/02371* (2013.01)

(58) Field of Classification Search
  CPC ............ H01L 23/66; H01L 2223/6677; H01L 2224/02379; H01L 21/56; H01L 2224/73267; H01Q 1/2283
  See application file for complete search history.

(56) References Cited

U.S. PATENT DOCUMENTS

| | | | | |
|---|---|---|---|---|
| 2010/0127937 A1* | 5/2010 | Chandrasekaran | ... | H01L 23/481 343/700 MS |
| 2012/0074512 A1* | 3/2012 | Ono | ...................... | H01Q 23/00 257/428 |
| 2014/0168014 A1* | 6/2014 | Chih | .................... | H01Q 1/2283 343/700 MS |
| 2019/0096828 A1* | 3/2019 | Wu | ....................... | H01L 21/565 |

* cited by examiner

*Primary Examiner* — Jasmine J Clark
(74) *Attorney, Agent, or Firm* — Parsons Behle & Latimer

(57) ABSTRACT

Systems and methods of manufacture are disclosed for a semiconductor device having an integral antenna. The semiconductor device includes a substrate having a plurality of metal layers within the substrate with the plurality of metal layers being adjacent to an active side of the substrate. An antenna structure is formed on one of metal layers. The antenna structure may be configured to be connected to an external device. The substrate may include a redistribution layer connected to the active side of the substrate. The antenna structure may be formed in the redistribution layer instead of being formed on one of the metal layers. The area of the antenna structure may be configured to enable a device connected to the antenna structure to operate on a communication network. The antenna structure may be configured to be a 5G network antenna.

15 Claims, 5 Drawing Sheets

ANTENNA FORMATION BY INTEGRATED METAL LAYER OR REDISTRIBUTION LAYER

FIELD OF THE DISCLOSURE

The embodiments described herein relate to antennas, such as millimeter wave antennas, integrated into a metal layer of a semiconductor device or a redistribution layer of the semiconductor device.

BACKGROUND

As computing devices become more integrated into society, data access and mobility are becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, available to be occupied by an antenna decreases as the density of devices attached to the PCB increases, which may result in larger, less mobile devices. These factors can make it difficult to incorporate millimeter wave antennas into mobile devices. Other issues, disadvantages, and drawbacks may exist.

DETAILED DESCRIPTION

Figure 1:
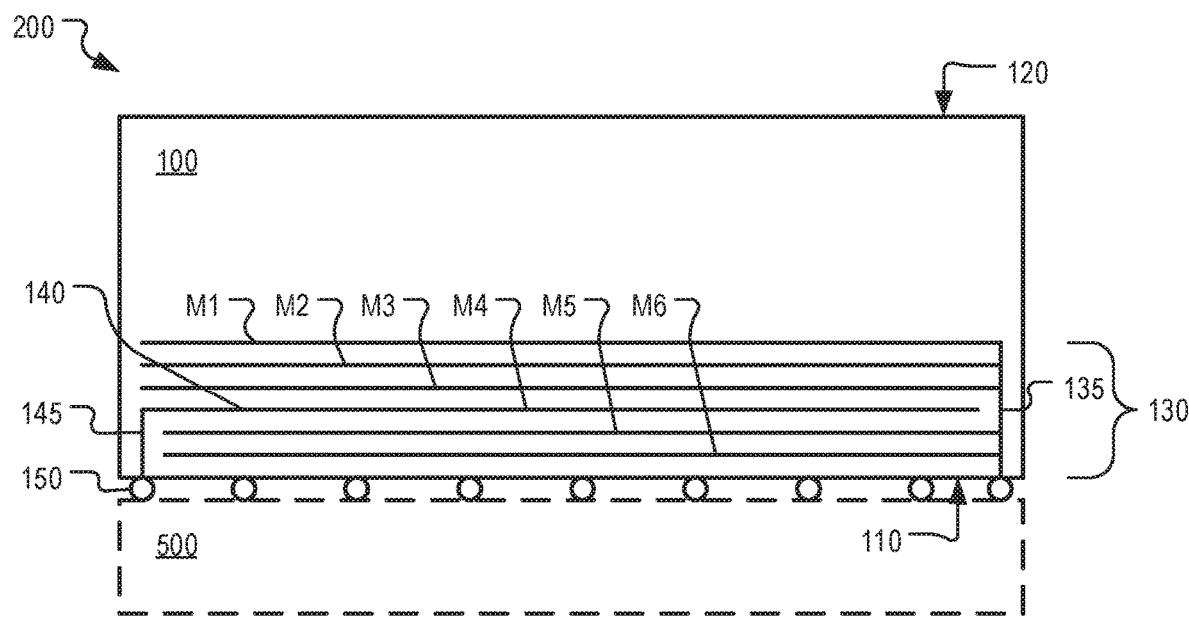
FIG. 1 is a cross-sectional side view schematic of one embodiment of a semiconductor device assembly with a semiconductor device with an integrated antenna.

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment a semiconductor device comprises a substrate having a first side and a second side opposite of the first side and a plurality of metal layers within the substrate, the plurality of metal layers adjacent to first side of the substrate. The semiconductor device comprises an antenna structure formed on one of metal layers, wherein the antenna is configured to be connected to an external device.

In another disclosed embodiment, a semiconductor device comprises a substrate having a first side and a second side opposite of the first side and a redistribution layer connected to the first side of the substrate. The first redistribution layer is configured to connect the semiconductor device to an external device. The semiconductor device comprises an antenna structure formed in the redistribution layer, the substrate is connected to the antenna structure through the redistribution layer.

In another disclosed embodiment, a semiconductor device assembly comprises a semiconductor device, an antenna structure that is integral to the semiconductor device, and an external device connected to the antenna structure. The semiconductor device may include a plurality of metal layers within the semiconductor device with the antenna structure formed on one of the plurality of metal layers. The semiconductor device may include a redistribution layer formed on a surface of the semiconductor device with the antenna structure formed within the redistribution layer.

Another disclosed embodiment is a method of making a semiconductor device assembly. The method comprises providing a substrate having an active side and an inactive side. The method comprises forming a plurality of metal layers within the substrate adjacent to the active side of the substrate and forming an antenna structure on one of the plurality of metal layers.

Also disclosed is a method for making a semiconductor device assembly. The method comprises providing a substrate having an active side and an inactive side. The method comprises forming a redistribution layer on the active side of the substrate and forming an antenna structure within the redistribution layer.

FIG. 1 is a cross-sectional side view schematic of a semiconductor device assembly 200 that includes a semiconductor device 100 connected to an external device 500. The semiconductor device 100 is a substrate having a first, or active, surface 110 and a second, or inactive, surface 120 opposite of the first surface 110. The substrate may be a silicon substrate. The semiconductor device 100 includes a first metal layer M1, a second metal layer M2, a third metal layer M3, a fourth metal layer M4, a fifth metal layer M5, and a sixth metal layer M6, which are collectively referred to as metal layers 130. The metal layers 130 may be formed within the substrate adjacent to the first, or active, surface 110 by various methods as would be appreciated by one of ordinary skill in the art having the benefit of this disclosure.

The metal layers incorporate an integrated antenna in accordance with disclosed embodiments. The fourth metal layer M4 of the plurality of metal layers 130 is formed to be an antenna structure 140. The antenna may be, but is not limited to, a 5G millimeter wave antenna for use with a 5G device or 5G devices. The first side 110 of the semiconductor device 100 includes a plurality of interconnects 150, which may be a solder ball grid, configured to connect the semiconductor device 100 to an external device 500. The external device 500 may be, but is not limited to, a radio communication device configured to operate on a 5G network. The antenna structure 140 is connected to the plurality of interconnects 150 via a conductive path 145. Likewise, the rest of the plurality of metal layers 130 are each connected to the plurality of interconnects 150 via a conductive path 135. The same conductive path may be used to connect the antenna structure 140 and the other metal layers M1-M3 and M5-M6 of the plurality of metal layers 130 as would be appreciated by one of ordinary skill in the art having the benefit of this disclosure.

The use of an integral antenna structure 140 within the metal layers 130 of the semiconductor device 100 eliminates the need to provide for an additional antenna structure on top of the semiconductor device 100, on a printed circuit board connected to the semiconductor device 100, or the like. The antenna structure 140 being formed on the fourth metal layer M4 is shown for illustrative purposes and any of the metal layers M1-M6 of the plurality of metal layers 130 may be formed as an antenna structure. Likewise, the plurality of metal layers 130 may comprise more, or less than, the six (6) layers M1-M6 shown in FIG. 1. The antenna structure 140 is configured to enable the external device 500 to transmit and/or receive using the antenna structure 140, which is electrically connected to the external device 500 via the plurality of interconnects 150.

Figure 2:
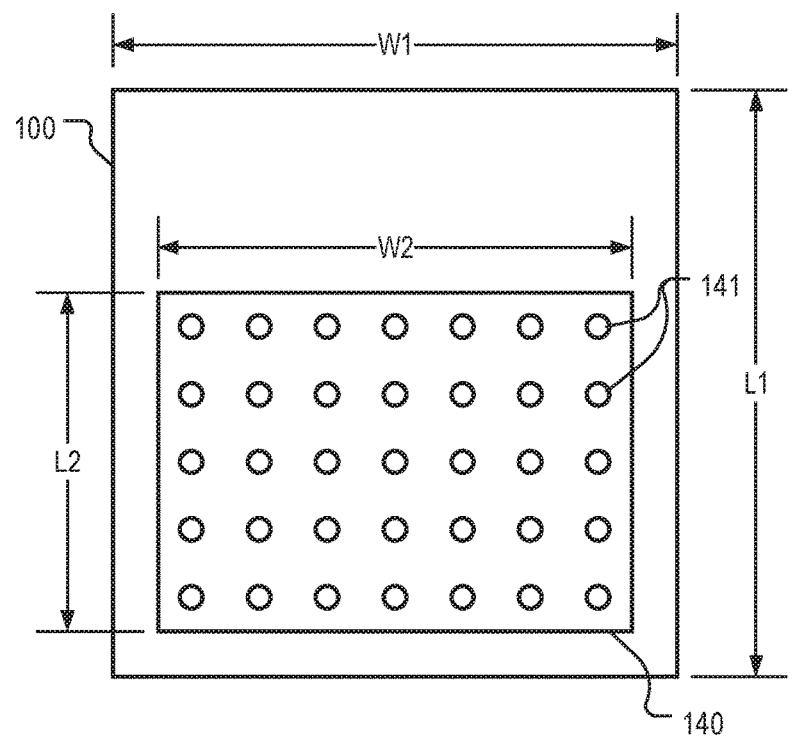
FIG. 2 is a schematic of an embodiment of an integrated antenna within a semiconductor device.

FIG. 2 is a schematic of an embodiment of an integrated antenna structure 140 within a semiconductor device 100. As discussed herein, the antenna structure 140 may be formed on a metal layer within the semiconductor device 100. The semiconductor device 100 has a first area, which is the product of the width, W1, of the semiconductor device 100 and the length, L1, of the semiconductor device 100. For example, the area of the semiconductor may range between, but is not limited to, 50 mm$^2$ to 130 mm$^2$. The integrated antenna structure 140 is configured to have a second area, which is the product of the width, W2, of the antenna structure and the length, L2, of the antenna structure 140. The second area of the antenna structure 140 is configured to enable an external device connected to the antenna structure 140 to be able to utilize the antenna structure 140.

In an embodiment, the second area of the antenna structure 140 may not need to be as large as the first area of the semiconductor device 100. For example, the second area may be less that the first area, but at least 50% of the first area. In one example, the second area could be less than 50% of the first area. In another example, the second area could be greater than 10% of the first area. In one example, the second area may range between 25 mm$^2$ to 100 mm$^2$. The antenna structure 140 may include a plurality of perforations, or apertures, 141 in the antenna structure 140. The perforations 141 may increase the adhesion of the antenna structure 140 to the substrate of the semiconductor device 100. The design, shape, size, and/or pattern of the perforations 141 may also be utilized configure the antenna structure 140 to have a specified overall area and/or shape as would be appreciated by one of ordinary skill in the art having the benefit of this disclosure.

Figure 3:
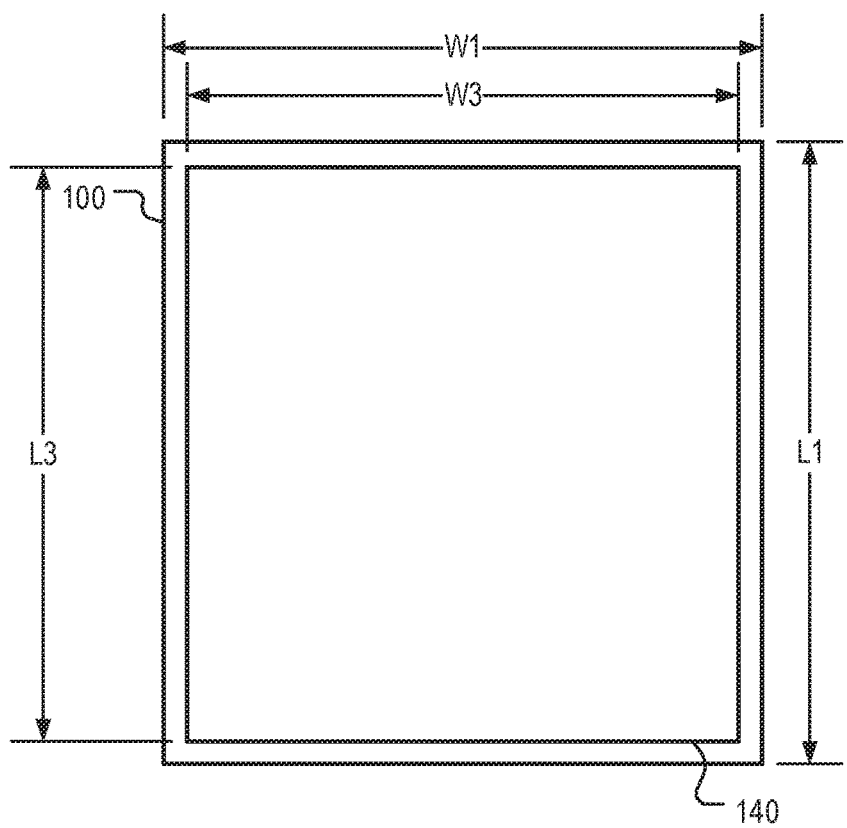
FIG. 3 is a schematic of an embodiment of an integrated antenna within a semiconductor device.

FIG. 3 is a schematic of an embodiment of an integrated antenna structure 140 within a semiconductor device 100. As discussed herein, the antenna structure 140 may be formed on a metal layer within the semiconductor device 100. The semiconductor device 100 has a first area, which is the product of the width, W1, of the semiconductor device 100 and the length, L1, of the semiconductor device 100. The integrated antenna structure 140 is configured to have a third area, which is the product of the width, W3, of the antenna structure and the length, L3, of the antenna structure 140. The third area of the antenna structure 140 may be greater than the second area of the antenna structure of FIG. 2. The third area of the antenna structure 140 may be slightly smaller than the first area of the semiconductor device 100. The third area of the antenna structure 140 is configured to enable an external device connected to the antenna structure 140 to be able to utilize the antenna structure 140

Figure 4:
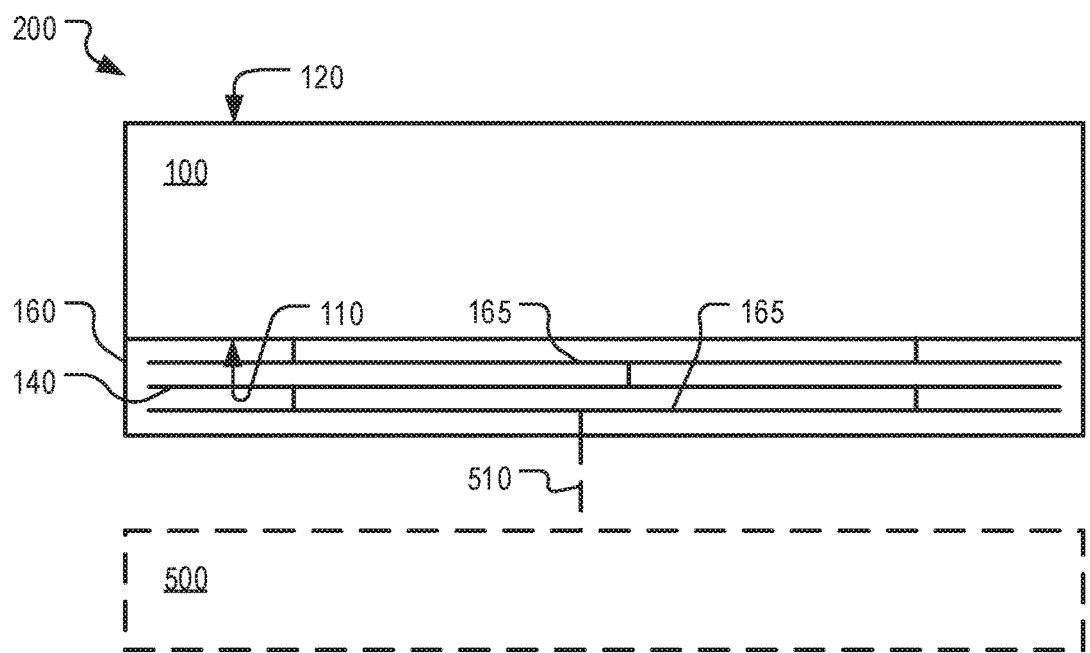
FIG. 4 is a cross-sectional side view schematic of one embodiment of a semiconductor device assembly incorporating an integrated antenna within a redistribution layer of a semiconductor device.

FIG. 4 is a cross-sectional side view schematic of a semiconductor device assembly 200 that includes a semiconductor device 100 connected to an external device 500 via a connection 510. The external device 500 may be connected by various mechanisms to the semiconductor device 100 as would be appreciated by one of ordinary skill in the art having the benefit of this disclosure. The semiconductor device 100 is a substrate having a first, or active, surface 110 and a second, or inactive, surface 120 opposite of the first surface 110. The semiconductor device 100 includes a redistribution layer 160 formed on the active surface 110 of the semiconductor device 100. The redistribution layer 160 may be configured to connect the semiconductor device 100 to another device as would be appreciated by one of ordinary skill in the art. The redistribution layer 160 may connect the semiconductor device 100 to the antenna structure 140 as well as connect the antenna structure 140 to an external device 500.

The redistribution layer 160 includes a plurality of conductive paths 165 that enable the semiconductor device 100 to be connected to another device. The redistribution layer 160 includes an antenna structure 140 formed within the redistribution layer 160. The antenna may be, but is not limited to, a 5G millimeter wave antenna for use with a 5G device or 5G devices. The antenna structure 140 is configured to enable the external device 500 to transmit and/or receive using the antenna structure 140, which is electrically connected to the external device 500 via the plurality of interconnects 150.

Figure 5:
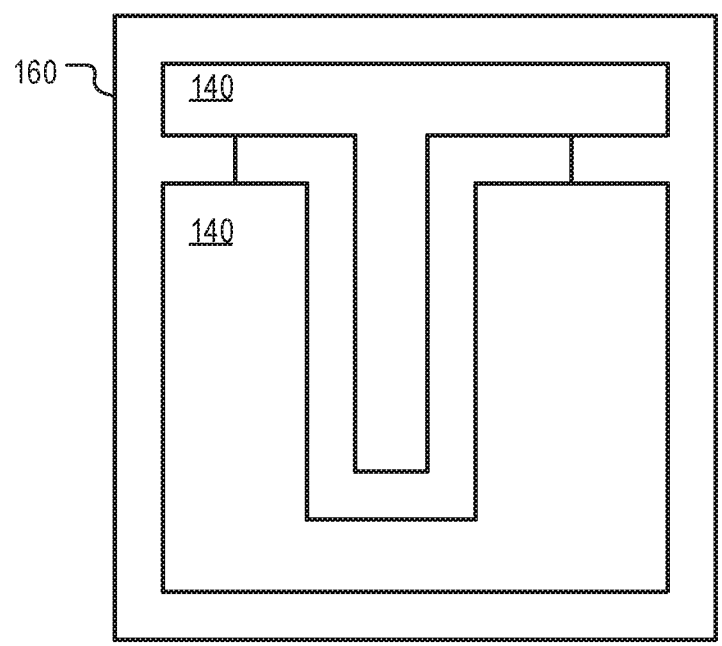
FIG. 5 is a schematic of an embodiment of an integrated antenna within a redistribution layer of a semiconductor device.

FIG. 5 is a schematic of an embodiment of an integrated antenna structure 140 within a redistribution layer 160. The area of the integrated antenna structure 140 may be configured to enable the operation of a specific external device connected to the antenna structure 140 via the redistribution layer 160. For example, the area of the antenna structure 140 may be configured to enable communication on a 5G network. The antenna structure 140 shown in FIG. 5 is for illustrative purposes and the shape, size, and/or configuration of the antenna structure 140 may be varied depending on the application.

Figure 6:
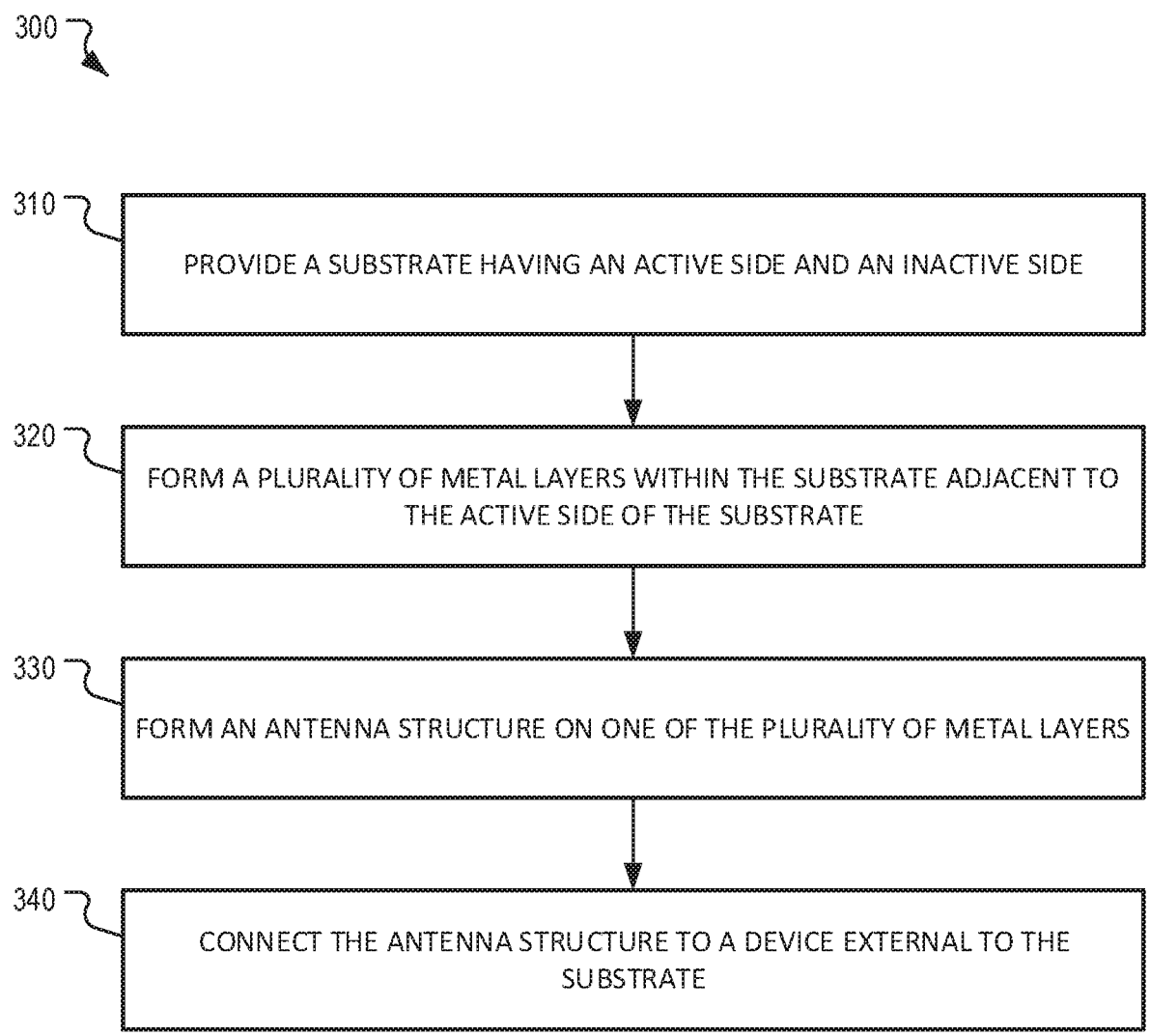
FIG. 6 is a flow chart showing an embodiment of a method of manufacturing a semiconductor device incorporating an integrated antenna.

FIG. 6 is a flow chart of one embodiment of a method 300 of making a semiconductor device assembly. The method 300 includes providing a substrate having an active side and an inactive side, at 310. The method 300 includes forming a plurality of metal layers within the substrate adjacent to the active side of the substrate, at 320. The method 300 includes forming an antenna structure on one of the plurality of metal layers, at 330. The method 300 may include connecting the antenna structure to a device external to the substrate, at 340.

Figure 7:
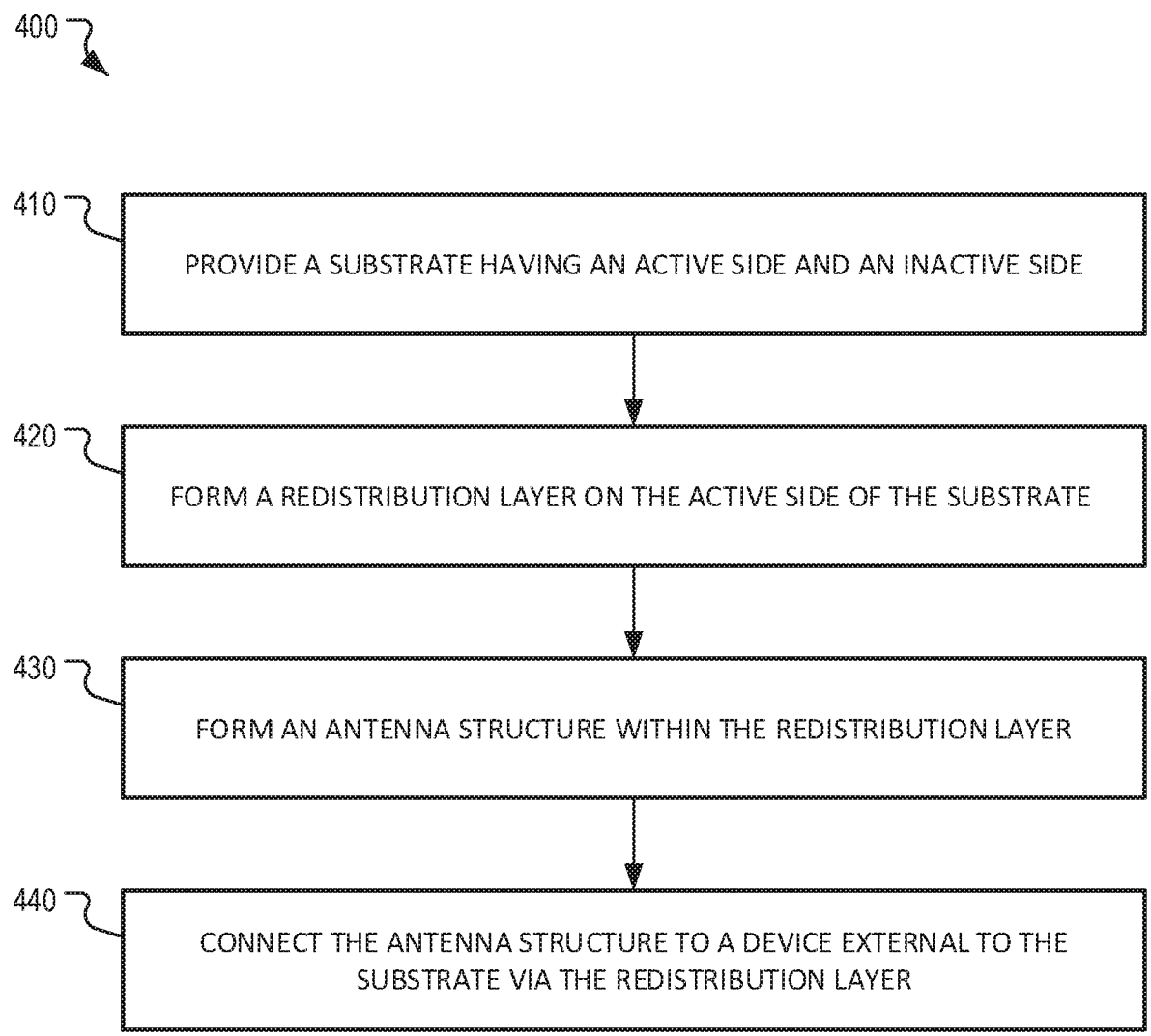
FIG. 7 is a flow chart showing an embodiment of a method of manufacturing a semiconductor device incorporating an integrated antenna While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the spirit and scope of the invention as defined by the appended claims.

FIG. 7 is a flow chart of one embodiment of a method 400 of making a semiconductor device assembly. The method 400 includes providing a substrate having an active side and an inactive side, at 410. The method 400 includes forming a redistribution layer on the active side of the substrate, at 420. The method 400 includes forming an antenna structure within the redistribution layer, at 430. The method 400 may include connecting the antenna structure to a device external to the substrate via the redistribution layer, at 440.

Although various embodiments have been shown and described, the present disclosure is not so limited and will be understood to include all such modifications and variations are would be apparent to one skilled in the art.

What is claimed is:

1. A semiconductor device comprising:
    a substrate having a first side and a second side opposite to the first side;
    a plurality of metal layers within the substrate, the plurality of metal layers adjacent to the first side of the substrate; and
    an antenna structure formed on one of the metal layers, wherein the antenna structure is configured to be connected to an external device, wherein the first side of the substrate is an active surface of the semiconductor device.

2. The semiconductor device of claim 1 wherein the antenna structure is a 5G millimeter wave antenna.

3. The semiconductor device of claim 1, wherein the first side of the substrate has a first area and the antenna structure has a second area, wherein the second area is at least 10% or more of the first area.

4. A semiconductor device comprising:
    a substrate having a first side and a second side opposite to the first side;
    a plurality of metal layers within the substrate, the plurality of metal layers adjacent to the first side of the substrate; and
    an antenna structure formed on one of the metal layers, wherein the antenna structure is configured to be connected to an external device, wherein antenna structure comprises a plurality of perforations.

5. A semiconductor device comprising:
    a substrate having a first side and a second side opposite to the first side;
    a plurality of metal layers within the substrate, the plurality of metal layers adjacent to the first side of the substrate; and
    an antenna structure formed on one of the metal layers, wherein the antenna structure is configured to be connected to an external device, wherein the substrate comprises a silicon substrate.

6. A semiconductor device comprising:
    a substrate having a first side and a second side opposite to the first side;
    a redistribution layer connected to the first side of the substrate, the redistribution layer configured to connect the substrate to an external device; and
    an antenna structure formed in the redistribution layer, the substrate is connected to the antenna structure through the redistribution layer.

7. The semiconductor device of claim 6, wherein the redistribution layer is configured to connect the antenna structure to the external device.

8. The semiconductor device of claim 6, wherein the antenna structure is a 5G millimeter wave antenna.

9. The semiconductor device of claim 6, wherein the first side of the substrate is an active surface of the semiconductor device.

10. A semiconductor device assembly comprising:
    a semiconductor device, the semiconductor device comprising a plurality of metal layers within the semiconductor device,
    an antenna structure that positioned within the semiconductor device, wherein the antenna structure is formed on one of the plurality of metal layers; and
    an external device connected to the antenna structure.

11. The semiconductor device assembly of claim 10, wherein the external device comprises a radio communication device.

12. A semiconductor device assembly comprising:
    a semiconductor device, the semiconductor device comprising a redistribution layer formed on a surface of the semiconductor device;
    an antenna structure that positioned within the semiconductor device, wherein the antenna structure is formed within the redistribution layer; and
    an external device connected to the antenna structure.

13. The semiconductor device assembly of claim 12, wherein the external device is connected to both the semiconductor device and the antenna structure via the redistribution layer.

14. A method for making a semiconductor device assembly, the method comprising:

providing a substrate having an active side and an inactive side forming a plurality of metal layers within the substrate adjacent to the active side of the substrate; and forming an antenna structure on one of the plurality of metal layers.

15. The method of claim 14, connecting the antenna structure to a device external to the substrate.

\* \* \* \* \*